(12) United States Patent  (10) Patent No.: US 7,498,813 B2
Giaquinto et al.  (45) Date of Patent: Mar. 3, 2009

(54) MULTI-CHANNEL LOW LOSS MRI COIL

(75) Inventors: Randy Otto John Giaquinto, Burnt Hills, NY (US); Charles Lucien Dumoulin, Ballston Lake, NY (US); Christopher Judson Hardy, Schenectady, NY (US); Harvey Ellis Cline, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/677,655

(22) Filed: Feb. 22, 2007

(65) Prior Publication Data

US 2007/0257670 A1 Nov. 8, 2007

Related U.S. Application Data

(60) Provisional application No. 60/797,717, filed on May 4, 2006.

(51) Int. Cl.
*G01V 3/00* (2006.01)

(52) U.S. Cl. ................................ 324/318; 324/322

(58) Field of Classification Search ......... 324/300–322; 600/407–455
See application file for complete search history.

(56) References Cited

U.S. PATENT DOCUMENTS

| | | | |
|---|---|---|---|
| 5,386,191 A * | 1/1995 | McCarten et al. ........... 324/318 |
| 5,706,812 A * | 1/1998 | Strenk et al. ............... 600/417 |
| 6,163,717 A | 12/2000 | Su |
| 6,166,705 A * | 12/2000 | Mast et al. .................. 343/853 |
| 6,198,962 B1 | 3/2001 | Su |
| 6,326,789 B1 * | 12/2001 | Yoshida et al. ............. 324/318 |
| 6,774,848 B2 * | 8/2004 | Wright ................ 343/700 MS |
| 6,850,065 B1 | 2/2005 | Fujita et al. |
| 6,876,199 B2 * | 4/2005 | Hardy et al. ................ 324/309 |
| 6,879,159 B2 * | 4/2005 | Yoshida ...................... 324/318 |
| 6,889,073 B2 | 5/2005 | Lampman et al. |
| 6,906,518 B2 * | 6/2005 | Leussler ..................... 324/318 |
| 7,023,209 B2 * | 4/2006 | Zhang et al. ................ 324/318 |
| 7,171,256 B1 | 1/2007 | Graessle et al. |
| 7,282,915 B2 * | 10/2007 | Giaquinto et al. ........... 324/318 |
| 2006/0022675 A1 * | 2/2006 | Blank et al. ................. 324/316 |

* cited by examiner

*Primary Examiner*—Brij B Shrivastav
(74) *Attorney, Agent, or Firm*—Eileen W. Gallagher

(57) ABSTRACT

A coil array for use in magnetic resonance imaging (MRI) is provided and comprises a plurality of low loss coil elements and at least one non-conducting substrate adapted to position the plurality of low loss coil elements in a fixed position thereon. Further, a coil array assembly for use in a magnetic resonance imaging (MRI) scanner is provided. The coil array assembly comprises a pair of coil arrays, wherein each coil array comprises: a plurality of low loss coil elements and at least one non-conducting substrate adapted to position the plurality of low loss coil elements in a fixed position thereon. Further, the pair of coil arrays are coupled to the MRI scanner for receiving imaging signals in a region of interest excited within the pair of coil arrays. Further, the coil array is adapted for use in breast imaging.

21 Claims, 5 Drawing Sheets

MULTI-CHANNEL LOW LOSS MRI COIL

CROSS REFERENCE TO RELATED APPLICATIONS

This application is related to Provisional Application U.S. Ser. No. 60/797,717, filed May 4, 2006 in the U.S. Patent and Trademark Office, the contents of which are incorporated herein by reference, and the benefit of priority to which is claimed under 35 U.S.C. 119(e).

BACKGROUND

The invention relates generally to radiofrequency (RF) coils for use in Magnetic Resonance Imaging (MRI) and more particularly, the invention relates to RF coils for use in MRI systems employing multiple receiver channels.

MRI systems employing multiple receiver channels allow for simultaneous acquisition of image data, and thus enable a reduction in acquisition time, that is desirable in a number of clinical applications. In order to obtain image data using a multiple receiver coil configured MRI scanner, a corresponding number of RF coils are assembled and each RF coil is coupled to a respective receiver channel. Currently, multiple RF coil assemblies are constructed as an array, such that each RF coil in the array is placed close to the anatomy of interest. Arrays can be constructed to provide optimal imaging for the chest, pelvis, head or other parts of the body.

In a typical multiple coil array arrangement, several adjacent coils are provided for receiving signals during imaging. However, there are a number of design challenges in providing the capability of multiple receive channels and multiple coils. For example, the size of coils needed to support a multi-channel MRI system must be sufficiently small to fit within a typical 40 cm field of view of a conventional MRI system, or a smaller field of view for some applications. Additionally, the coil size and corresponding arrangement within a coil array will present with inherent inductive coupling and sensitivity issues which both can negatively impact the quality (Q) factor and loading factors of the coils, thereby limiting overall signal-to-noise ratio (SNR) performance of the coils and MRI system during imaging. The Q factor is an important indication of the RF coil sensitivity to induced currents in response to signals emanating from the subject or patient being imaged. Further, the patient "loading" effects, eddy currents among other things, can cause coil losses that lead to lower SNR.

Thus, there is a need a for highly coupled RF coil assembly having high Q and high loading factor MRI coils for use in a multi-channel MRI system

BRIEF DESCRIPTION

In a first aspect, a coil array for use in magnetic resonance imaging (MRI) is provided and comprises a plurality of low loss coil elements and at least one non-conducting substrate containing adapted to position the plurality of low loss coil elements in a fixed position thereon.

In a second aspect, a coil array assembly for use in a magnetic resonance imaging (MRI) scanner is provided. The coil array assembly comprises a pair of coil arrays, wherein each coil array comprises: a plurality of low loss coil elements and at least one non-conducting substrate containing adapted to position the plurality of low loss coil elements in a fixed position thereon. Further, the pair of coil arrays are coupled to the MRI scanner for receiving imaging signals in a region of interest excited within the pair of coil arrays.

In a third aspect, a breast coil array assembly for use in breast imaging using a magnetic resonance imaging (MRI) scanner is provided. The coil array assembly comprises a pair of coil arrays, wherein each coil array comprises: a plurality of low loss coil elements and at least one non-conducting substrate containing adapted to position the plurality of low loss coil elements in a fixed position thereon. Further, the pair of coil arrays are coupled to the MRI scanner for receiving imaging signals in a region of interest excited within the pair of coil arrays.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Referring to the Figures, various embodiments of the present invention are provided. Desirably, a multiple coil array according to embodiments of the invention has a simple design comprising low-loss elements such as heavy copper. Additionally, the array comprises baluns and other electronics necessary for performance, however the preamplifiers are preferably remote from the coil elements. Further, the array avoids parasitic circuits (e.g. redundant blocking). Additionally, overlapping coils are desirable and the coils should be non-flexible.

Figure 1:
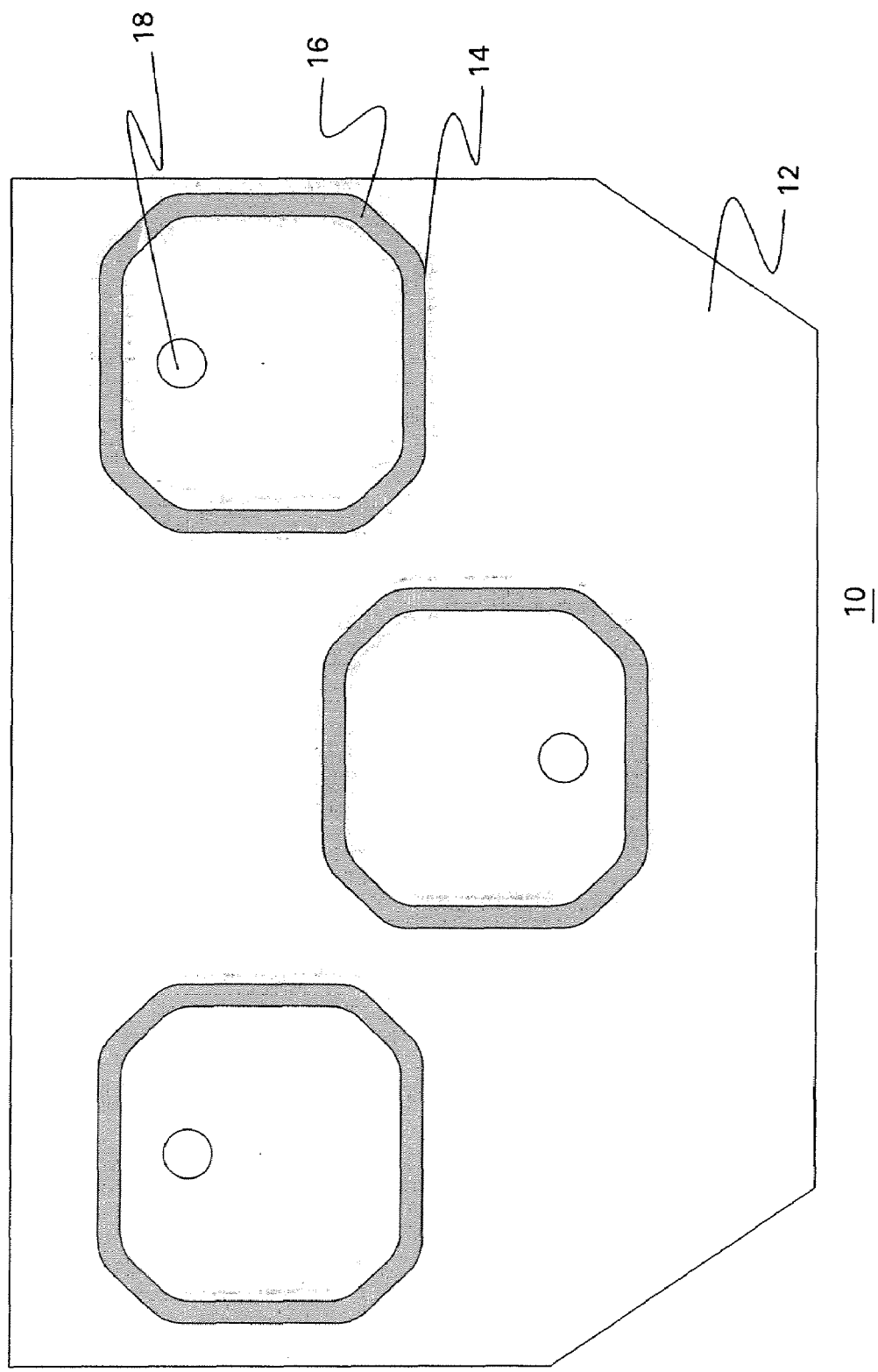
FIG. 1-3 are schematic illustrations of a coil array to which embodiments of the present invention are applicable.

FIG. 1 shows an exemplary embodiment of a coil array 10 for use in embodiments of a multiple coil array. As shown in FIG. 1, a non-conductive substrate 12 includes grooves or pockets 14 for positioning coil elements 16 in a fixed position. Coil elements 16 are arranged in a given pattern, for example non-overlapped with respect to one another. The coil elements 16 are desirably solid copper versus etched copper of current coils. The copper is considered sufficiently heavy, for example greater than or equal to 0.03 in. in thickness. The solid copper elements enable increased Q. Further, substrate 12 contains alignment holes 18, which will be described in greater detail below with reference to a multiple coil array assembly. The coil elements 16 are electro-polished to increase the Q factor further. Baluns (not shown) provide high isolation between the coil elements 16 and suppress common mode currents flowing on the coaxial cable shield (not shown but of the coil element) that may cause undesirable cable/coil interactions. The balun is shielded to ensure there is no coupling between the balun inductor and other coils in the magnet bore including the body coil and the coils of the multiple coil array.

Figure 2:
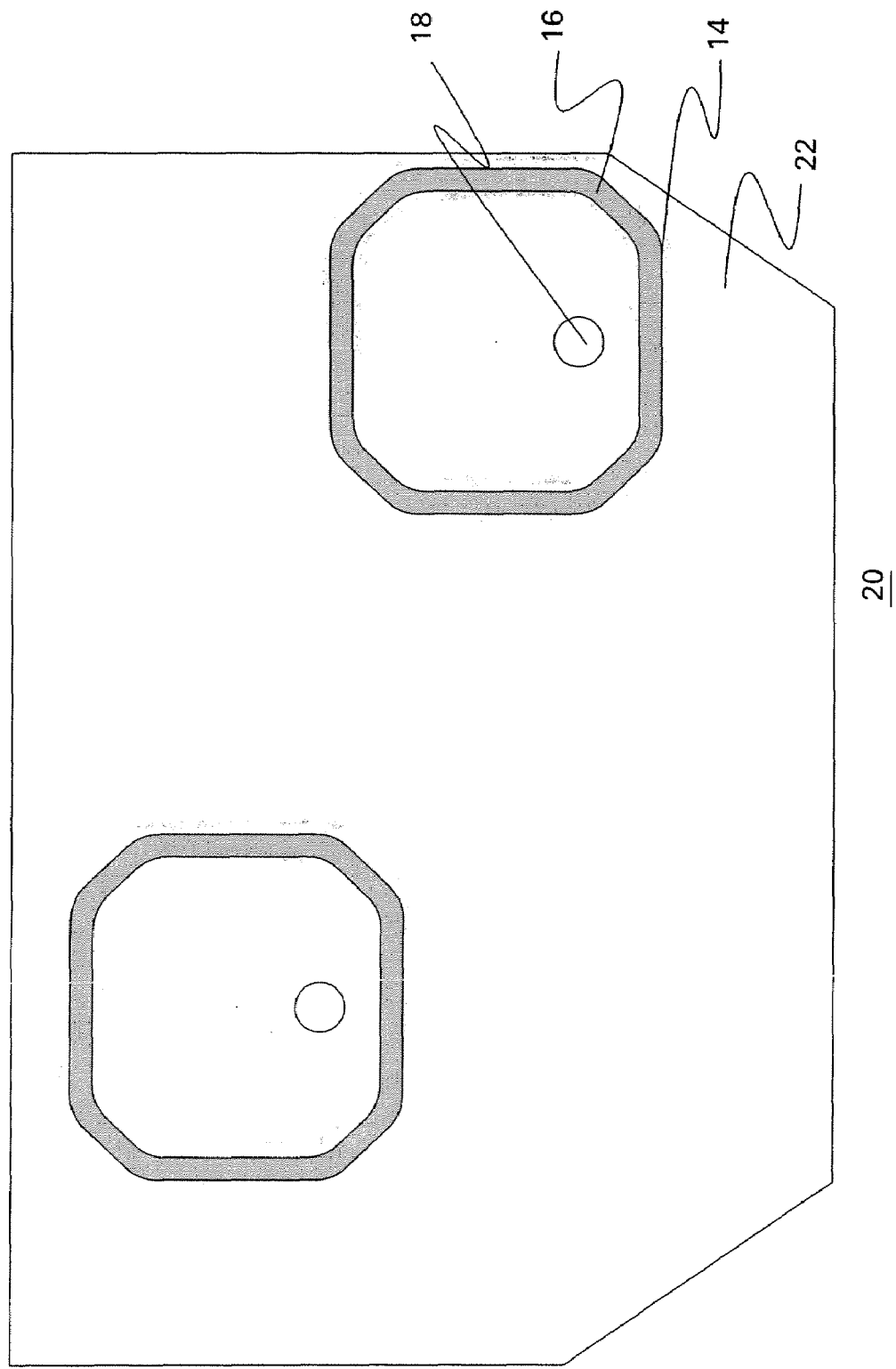
Figure 3:
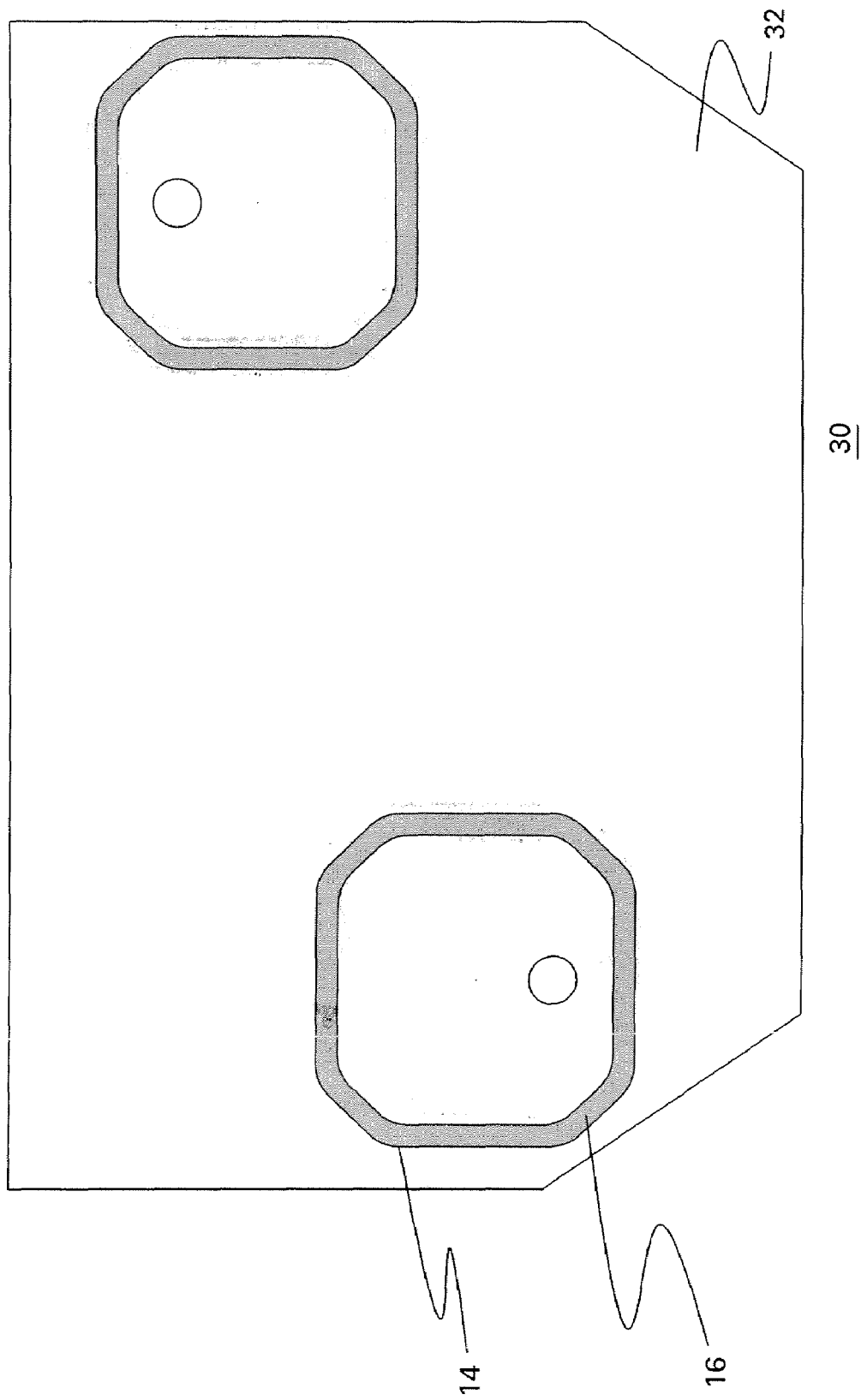

Referring now to FIG. 2, an embodiment of coil array 20 for use in embodiments of multiple coil array is shown. Similar to the description with reference to FIG. 1, a non-conductive substrate 22 includes grooves or pockets 14 for positioning coil elements 16 in a fixed position. Coil elements 16 are arranged in a different pattern than in FIG. 1 but also non-overlapped with respect to one another. Similarly, referring now to FIG. 3, an embodiment of a coil array 30 for use in embodiments of a multiple coil array is shown. However, a non-conductive substrate 32 is provided including grooves or pockets 14 for positioning coil elements in a fixed position wherein the position of the coil elements differs from that of previous coil arrays shown in FIGS. 1 and 2.

Figure 4:
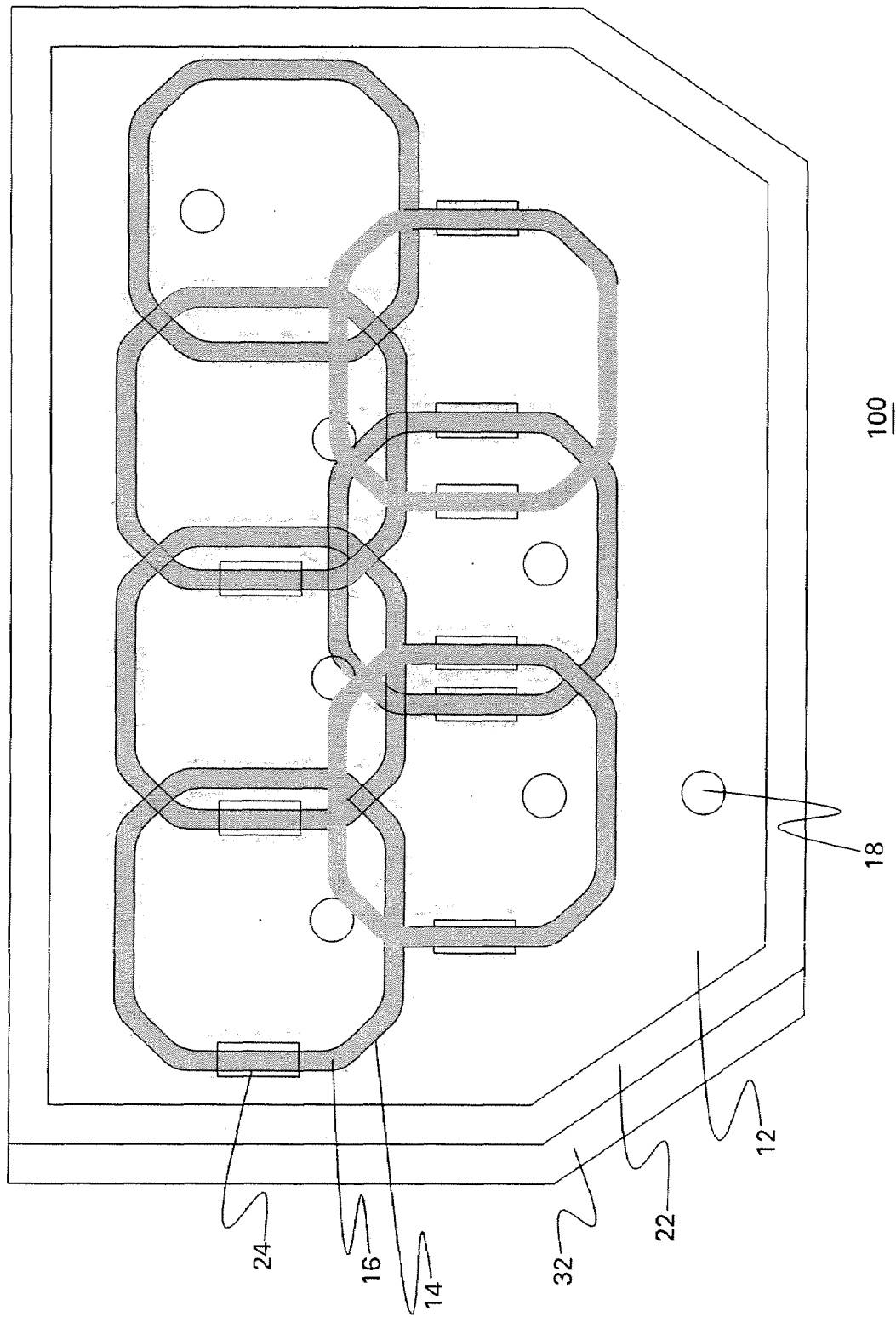
FIG. 4 is a schematic illustration of an assembled multiple coil array to which embodiments of the present invention are applicable; and, FIG. 5 is a schematic illustration of a breast coil assembly employing the multiple coil arrays from FIG. 1-4.

Referring to FIG. 4, an exemplary embodiment of a multiple coil array 100 and arrangement of coil elements 16 is shown. As shown, at least one substrate, for example 12, 22 and 32 of FIGS. 1-3, made of Lexan® or other polycarbonate and non-conductive materials is machined or otherwise adapted to create a machined pocket or groove 14 to accommodate the coil elements 16. As such, the elements are held in a fixed position relative to the other coil elements. The coil elements 16 may be further affixed into the grooves or pockets 14 using epoxy or other similar materials. This configuration advantageously maintains the coil elements 16 in place and obviates the need for "stitching" between layers (and hence lowers losses in the assembled array). As used herein "stitching" refers to plated-through via holes connecting one layer of element to another. As shown in FIG. 4, a seven (7)-element coil array 100 is shown which as been constructed by layering the coil array 10 of FIG. 1, the coil array 20 of FIG. 2 and the coil array 30 of FIG. 3. The use of embedded heavy copper elements into polycarbonate on specific layers is different than what is used conventionally, i.e. printed circuit boards. Alignment holes 18 are provided to align the various layered coil arrays. Further, coil interface circuits 24 incorporating baluns provide high isolation between the coil elements 16 and suppress common mode currents flowing on the coaxial cable shield (not shown but of the coil element) that may cause undesirable cable/coil interactions. The balun is shielded to ensure there is no coupling between the balun inductor and other coils in the magnet including the body coil and the coil elements of the multiple coil array. Therefore, the techniques of the present invention result in less loss due to stitching via holes between layers on a printed circuit design. Further, each coil is able to be tuned in place without the need for any decoupling components, aiding the performance of the coil array.

Typically, all coil elements in a coil array have some degree of coupling and as such some decoupling and/or tuning will be required. Further, any component added to decouple the coils will add resistive losses and possible flux shielding losses which will degrade SNR. In embodiments of the present invention, some tuning is required for decoupling of the array. Conventional tuning may be employed, such as adding capacitors (not shown) for tuning and matching.

The array 100 will further comprise a plurality of preamplifiers coupled to each of the coil elements 16. The preamplifiers are provided for amplifying the weak MR signals prior to propagation of the signal to the respective MR system receiver. It is well known to those skilled in the art that the most efficient transfer of energy between circuit elements in an electronic circuit occurs when the impedance between elements is matched. In the case of an RF coil and an MR preamplifier, optimum efficiency in the transfer of energy corresponds to an optimum in the detected Signal-to-Noise Ration (SNR). In embodiments of the present invention, the impedance and matching requirements of the array may be met with the preamplifiers being remote from the coil without affecting the coupling or SNR. Placing the preamplifiers remote from the coil can have the advantageous property of minimizing the disturbance of magnetic flux in the sensitive volume of the RF coil.

Further, the coils are desirably arranged to be overlapping relative to one another. In exemplary embodiments, signal to noise ratio (SNR) and accelerations (defined as the increase in acquisition speed afforded by the use of multiple receive coils) are higher than of underlapped coil configurations.

Figure 5:
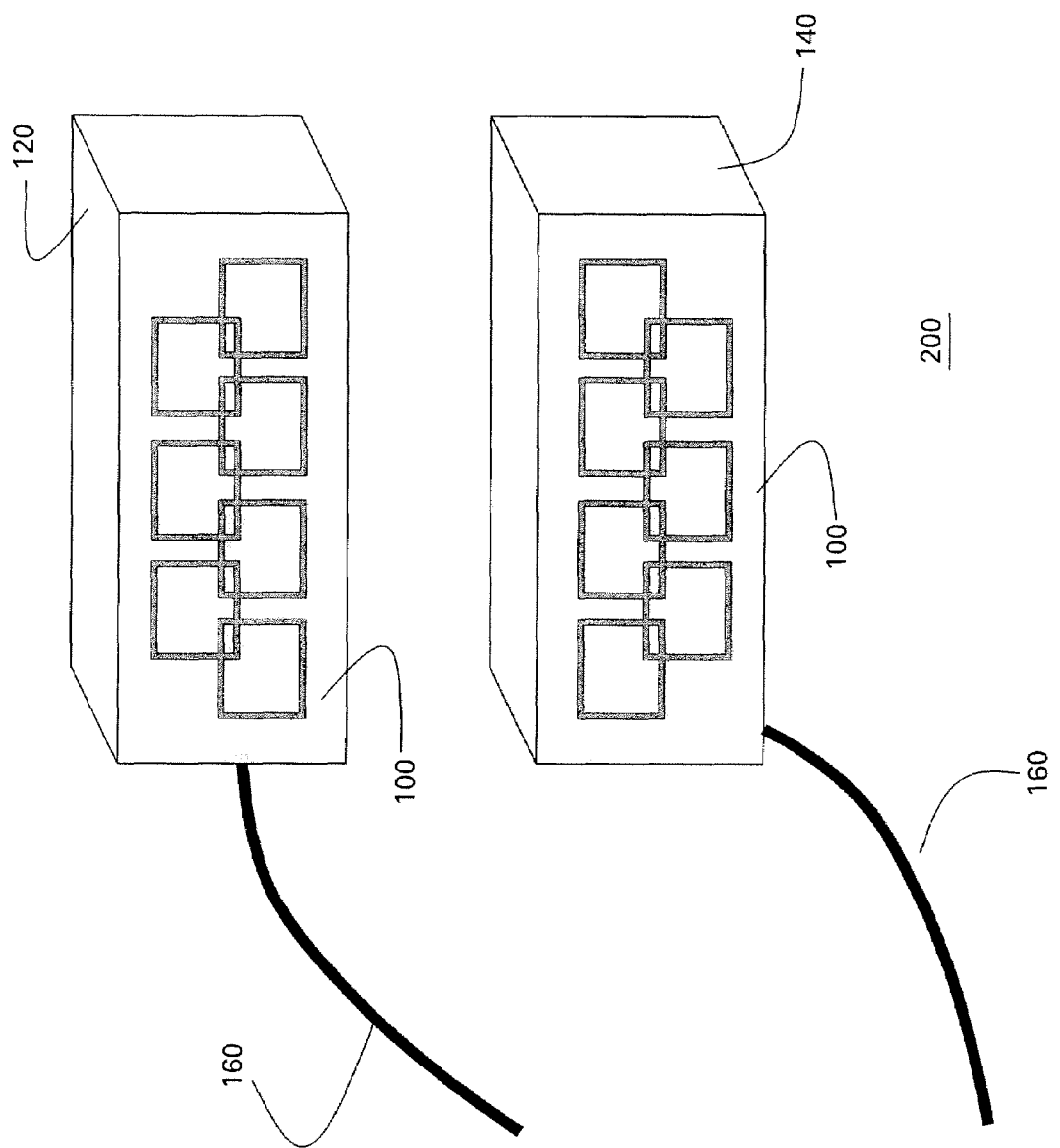

FIG. 5 is an illustration of an exemplary 14-channel breast coil array 200 constructed in accordance with embodiments described herein. In this embodiment, 14 coils are provided by assembling a 7-element coil assembly 100 (shown and described with reference to FIG. 4) into a lateral coil 120 and a 7-element coil assembly into a medial coil 140 for use in placement around a breast for imaging. In an exemplary use of the breast coil array, the subject patient (not shown) may be in the prone position lying on the breast coil array, and placed head first into the MRI scanner. All MR coils are orthogonal to the chest wall. In a further exemplary embodiment, two medial 140 and two lateral plates 120 totaling 28 coils are used to simultaneously image both breasts. The medial coils are angled ~20 degrees at the bottom to assist in a smaller sternum contact are on the patient. This allows both breasts to be imaged completely on the medial side of each breast. The two lateral plates are each set on rails of the MRI system and have a cam lock setup (not shown) to adjust the plates for desired compression, adjustable depending on application (e.g. slight compression for imaging and heavier compression for biopsy). Further provided is cable assembly 160 to store cables coupled to the receiver channels of the MRI system (not shown) in a well-known manner. It is to be appreciated that embodiments of the present invention could be extended to other coil arrays, such as torso coil arrays, and that the breast coil configuration is presented for exemplary purposes.

In an exemplary embodiment, a complete dense MRI Multi-channel Biopsy Compatible Breast Array is provided. This coil design has implemented the use of embedded heavy copper elements into polycarbonate (or other selected non-conducting substrate) on specific layers. A multi-channel breast array advantageously has high spatial and temporal resolution of breast cancer lesions needed to diagnose and treat breast cancer at an early stage. A large array of coils has high loss due to many reasons; low Q elements, magnetic flux loss due to crowding components, and coupling between elements. All these problems have been addressed and overcome to produce high speed (7.6× for excellent fat and water separation) and high resolution (0.7×0.7 mm×0.7 mm image voxels), to detect and treat extremely small lesions, that have been until now not possible with MRI of the breast.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A coil array for receiving signals during magnetic resonance imaging (MRI) comprising:
    a plurality of low loss coil elements wherein the low lost elements are copper; and,
    at least one non-conducting substrate adapted to position the plurality of low loss coil elements in a fixed position thereon.

2. The coil array of claim 1 wherein the low loss coil elements are constructed of copper having a thickness of about 0.03 inches or greater.

3. The coil array of claim 2 wherein the low loss coil elements are constructed of polished copper.

4. The coil array of claim 1 wherein the at least one non-conducting substrate is a first substrate and the coil array further comprises at least one additional non-conducting substrate for positioning an additional plurality of low loss coil elements thereon, and the additional substrate is coupled to the first non-conducting substrate to form a coil array assembly.

5. The coil array of claim 1 wherein the at least one substrate comprises embedded grooves thereon for positioning the low loss elements.

6. The coil array of claim 5 wherein the grooves are machined and/or etched onto the substrate and wherein the grooves are sized to accommodate the low loss coil elements.

7. The coil array of claim 5 wherein the low loss coil elements are affixed within the grooves of the substrate with adhesive.

8. The coil array of claim 4 wherein the coil array assembly is constructed by layering the first substrate and additional substrates, and wherein each respective layer contains coil elements in a given arrangment.

9. The coil array of claim 8 further comprising baluns and electronics coupled to the low loss coil elements.

10. The coil array of claim 8 wherein the respective layers contain non-overlapping coil elements and when layered form overlapping coil elements.

11. The coil array of claim 1 wherein the substrate is non-flexible.

12. The coil array of claim 1 wherein the low-loss coil elements are constructed without stitching.

13. A coil array assembly for use in a magnetic resonance imaging (MRI) scanner, the coil array assembly comprising:
a pair of coil arrays, wherein each coil array comprises:
a plurality of low loss coil elements wherein the low lost elements are copper;
at least one non-conducting substrate adapted to position the plurality of low loss coil elements in a fixed position thereon; and,
wherein the pair of coil arrays are coupled to the MRI scanner for receiving imaging signals in a region of interest excited within the pair of coil arrays.

14. The coil array assembly of claim 13 wherein the coils array assembly is adapted for breast imaging.

15. The coil array of claim 13 wherein the low loss coil elements are constructed of copper having a thickness of about 0.03 inches or greater.

16. The coil array of claim 15 wherein the low loss coil elements are constructed of polished copper.

17. The coil array of claim 15 wherein the low loss coil elements are affixed within the grooves of the substrate with adhesive.

18. The coil array of claim 14 wherein each of the pair of coil array are constructed by layering the first substrate and additional substrates, and wherein each respective layer contains coil elements in a given arrangment.

19. The coil array of claim 15 wherein the low-loss coil elements are constructed without stitching.

20. A breast coil array assembly for use in breast imaging using a magnetic resonance imaging (MRI) scanner, the coil array assembly comprising:
a pair of coil arrays, wherein each coil array comprises:
a plurality of low loss coil elements wherein the low lost elements are copper; and,
at least one non-conducting substrate adapted to position the plurality of low loss coil elements in a fixed position thereon; and,
wherein the pair of coil arrays are coupled to the MRI scanner for receiving imaging signals in a breast region of interest excited within the pair of coil arrays.

21. The breast coil array assembly of claim 20 further comprising at least one cable assembly for coupling the breast coil array to the MRI scanner.

* * * * *